US012672262B2

(12) United States Patent
Liu et al.

(10) Patent No.: US 12,672,262 B2
(45) Date of Patent: Jun. 30, 2026

(54) LAMINATED GRAPHENE-BASED THERMALLY CONDUCTIVE FILM AND PAD AND METHOD FOR MANUFACTURING THE FILM AND PAD

(71) Applicant: SHT Smart High-Tech AB, Gothenburg (SE)

(72) Inventors: Johan Liu, Västra Frölunda (SE); Thien Laubeck, Gothenburg (SE)

(73) Assignee: SHT Smart High-Tech AB, Gothenburg (SE)

( * ) Notice: Subject to any disclaimer, the term of this patent is extended or adjusted under 35 U.S.C. 154(b) by 249 days.

(21) Appl. No.: 18/694,537

(22) PCT Filed: Sep. 26, 2022

(86) PCT No.: PCT/SE2022/050854
§ 371 (c)(1),
(2) Date: Mar. 22, 2024

(87) PCT Pub. No.: WO2023/055272
PCT Pub. Date: Apr. 6, 2023

(65) Prior Publication Data
US 2024/0407135 A1     Dec. 5, 2024

(30) Foreign Application Priority Data
Sep. 29, 2021     (SE) .................................... 2151195-1

(51) Int. Cl.
*H05K 7/20* (2006.01)
*B32B 9/00* (2006.01)
(Continued)

(52) U.S. Cl.
CPC ......... *H05K 7/20481* (2013.01); *B32B 9/007* (2013.01); *B32B 9/04* (2013.01);
(Continued)

(58) Field of Classification Search
CPC ...... B32B 2037/1253; B32B 2037/302; B32B 2310/0843; B32B 2313/04;
(Continued)

(56) References Cited

U.S. PATENT DOCUMENTS 6,538,892 B2 *  3/2003  Smalc ................... H10W 40/25
                                                257/706
6,886,249 B2 *  5/2005  Smalc ................. H10W 40/253
                                                257/E23.105
(Continued)

FOREIGN PATENT DOCUMENTS

CN        101048055 A      10/2007
CN        103681517 A       3/2014
(Continued)

OTHER PUBLICATIONS

Chinese Search Report dated Dec. 21, 2024 for Chinese Patent Application No. 202111467034.8, 2 pages.
(Continued)

*Primary Examiner* — Robert J Hoffberg
(74) *Attorney, Agent, or Firm* — RMCK Law Group, PLC

(57) ABSTRACT

A graphene-based thermally conductive film comprising a plurality of strips of a graphene film arranged so that graphene sheets of the graphene film are aligned in a direction perpendicular to the plane of the thermally conductive film, wherein the thermally conductive film comprises: a plurality of first area portions comprising strips of graphene film having a first rotational alignment in the plane of the thermally conductive film; and a plurality of second area portions comprising strips of graphene film having a second rotational alignment in the plane of the thermally conductive film, different from the first alignment.

5 Claims, 10 Drawing Sheets

(51) Int. Cl.
B32B 9/04 (2006.01)
B32B 37/12 (2006.01)
B32B 38/00 (2006.01)

(52) U.S. Cl.
CPC .......... B32B 37/12 (2013.01); B32B 38/0004 (2013.01); *B32B 2037/1253* (2013.01); *B32B 2307/302* (2013.01); *B32B 2310/0843* (2013.01); *B32B 2313/04* (2013.01); *B32B 2457/00* (2013.01)

(58) Field of Classification Search
CPC ......... B32B 2457/00; B32B 3/14; B32B 3/18; B32B 37/12; B32B 38/0004; B32B 38/1841; B32B 7/03; B32B 7/12; B32B 9/007; B32B 9/04; B32B 2038/0076; B32B 27/12; B32B 7/027; B82Y 30/00; B82Y 40/00; C01B 32/194; C01B 2204/24; C01B 32/182; H05K 7/2039; H05K 7/20472; H05K 7/20481; H10W 40/25; H10W 40/255; H10W 40/70
See application file for complete search history.

(56) References Cited

U.S. PATENT DOCUMENTS

| | | | | |
|---|---|---|---|---|
| 7,297,399 | B2 * | 11/2007 | Zhang | F28F 13/00 428/408 |
| 7,351,360 | B2 * | 4/2008 | Hougham | B82Y 30/00 252/502 |
| 9,314,817 | B2 * | 4/2016 | Wong | B05D 3/12 |
| 9,997,432 | B2 * | 6/2018 | Yamamoto | H10W 40/255 |
| 11,255,613 | B2 * | 2/2022 | Fan | F28F 21/02 |
| 12,226,996 | B2 * | 2/2025 | Liu | B32B 9/007 |
| 2002/0167800 | A1 | 11/2002 | Smalc | |
| 2006/0112857 | A1 | 6/2006 | Hougham et al. | |
| 2008/0019097 | A1 * | 1/2008 | Zhang | F28F 13/00 361/704 |
| 2011/0303399 | A1 * | 12/2011 | Sakimichi | F28F 21/04 165/185 |
| 2014/0070393 | A1 | 3/2014 | Bartley et al. | |
| 2015/0318269 | A1 | 11/2015 | Boday et al. | |
| 2019/0097215 | A1 | 3/2019 | Lee et al. | |
| 2021/0078288 | A1 | 3/2021 | Liu et al. | |

FOREIGN PATENT DOCUMENTS

| | | |
|---|---|---|
| JP | 2020016484 A | 1/2020 |
| WO | 2008087373 A2 | 7/2008 |
| WO | 2013067280 A1 | 5/2013 |
| WO | 2017014899 A1 | 1/2017 |
| WO | 2018160106 A1 | 9/2018 |
| WO | 2019194708 A1 | 10/2019 |
| WO | 2019235983 A1 | 12/2019 |
| WO | 2021108473 A1 | 6/2021 |

OTHER PUBLICATIONS

PCT International Search Report and Written Opinion dated Oct. 17, 2022 for International Application No. PCT/SE2022/050854, 8 pages.
Swedish Search Report dated May 16, 2022 for Swedish Application No. 2151195-1, 2 pages.
Extended European Search Report dated Jul. 4, 2025 for EP Application No. 22877014.5, 7 pages.

* cited by examiner 205
205
205

215

206

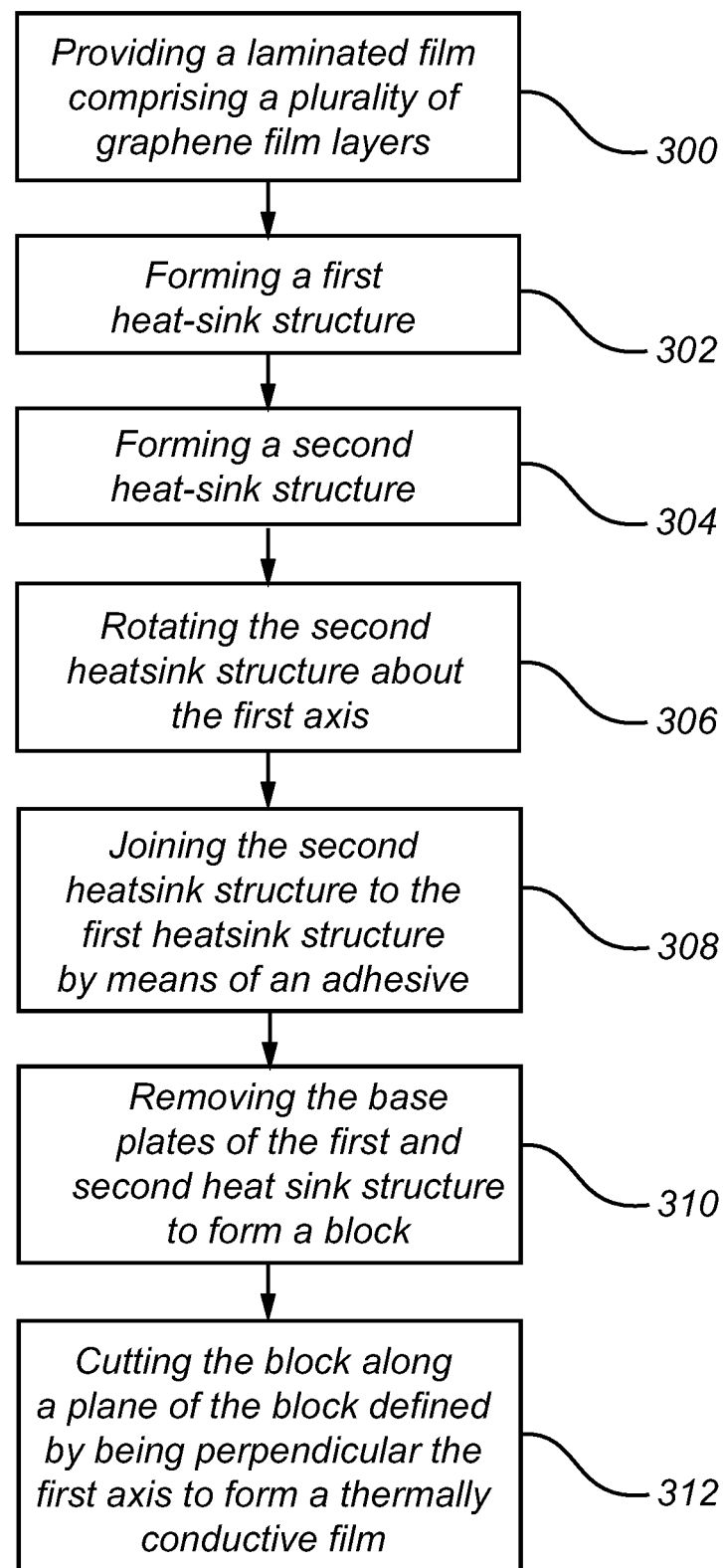

Providing a laminated film comprising a plurality of graphene film layers — 300

Forming a first heat-sink structure — 302

Forming a second heat-sink structure — 304

Rotating the second heatsink structure about the first axis — 306

Joining the second heatsink structure to the first heatsink structure by means of an adhesive — 308

Removing the base plates of the first and second heat sink structure to form a block — 310

Cutting the block along a plane of the block defined by being perpendicular the first axis to form a thermally conductive film — 312

*Fig. 3*

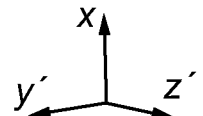
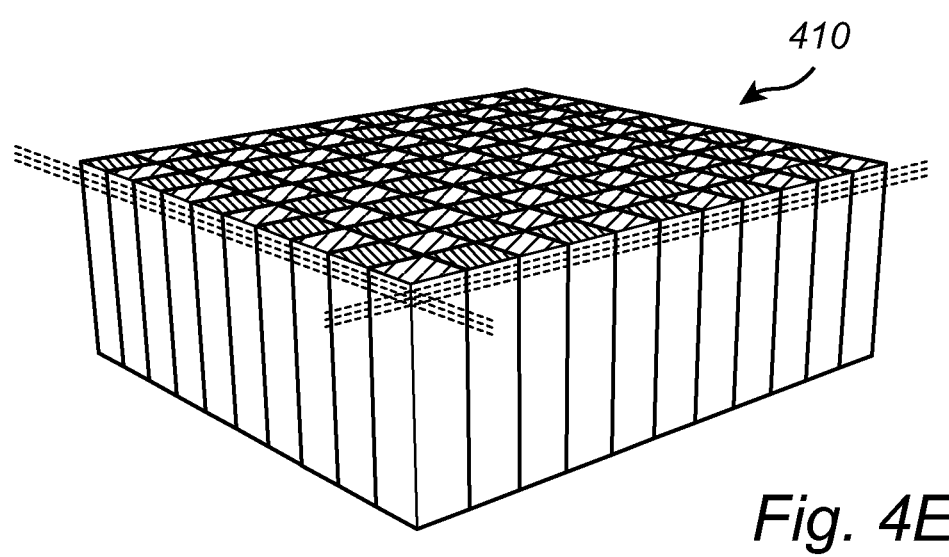
410
*Fig. 4E*
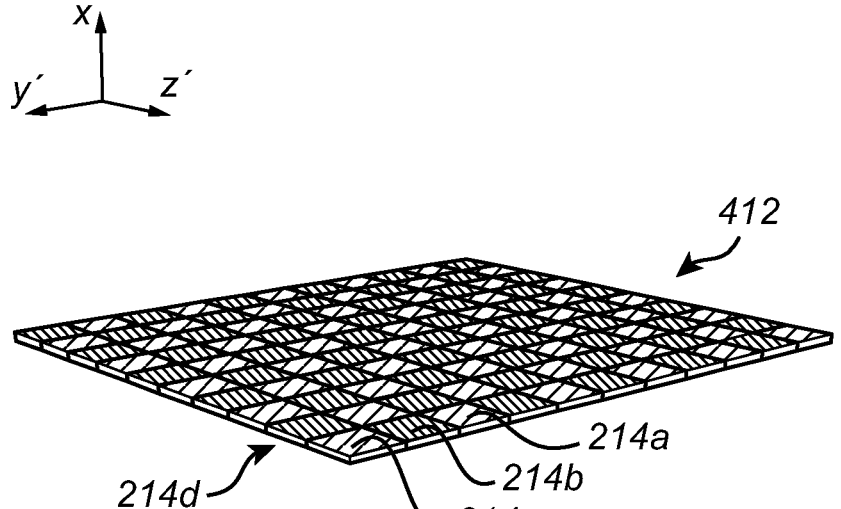
412
214a
214b
214d
214c
*Fig. 4F*

LAMINATED GRAPHENE-BASED THERMALLY CONDUCTIVE FILM AND PAD AND METHOD FOR MANUFACTURING THE FILM AND PAD

CROSS-REFERENCE TO RELATED APPLICATIONS

This application is a 371 U.S. National Stage of International Application No. PCT/SE2022/050854, filed Sep. 26, 2022, which claims priority to Swedish Application No. 2151195-1, filed Sep. 29, 2021. The disclosure of each of the above applications is incorporated herein by reference in its entirety.

FIELD OF THE INVENTION

The present invention relates to a laminated graphene based thermally conductive film and to a method for manufacturing such a film. In particular, the present invention relates to a thermally conductive film comprising portions of graphene film having different orientations. The thermally conductive film can be formed into pads for use as thermal interface material in electronics components.

BACKGROUND OF THE INVENTION

With the continuous development of modern electronics devices and systems, their increasing power densities have also caused higher operating temperatures. Therefore, effective thermal management is becoming extremely crucial for removing the large amount of heat required for ensuring high performance and long lifetime reliability. Thermal conductivity of traditional thermal interface materials (TIMs), a very important element for heat dissipation, is often less than max 10 W/mK, usually around 4 or 5 W/mK in vertical directions. Great efforts have hence been made to develop high performance TIMs based on carbon materials (e.g., graphite nano-platelets, carbon nanotubes and carbon fibers) in order to solve this problem.

A considerable number of studies have been devoted to increasing their thermal conductivity by increasing the graphene loading in graphene based thermally conductive adhesives. However, it is not practical for the fabrication process when the graphene content is too high.

Graphene, an allotrope of carbon which is comprised of only one layer of atoms arranged in a two-dimensional hexagonal lattice, exhibits a number of unique properties, such as ultrafast electron mobility, super high mechanical strength, and unusually superior thermal performance (in-plane thermal conductivity=5000 W/mK). Besides, it is necessary to arrange graphene into particular structures so as to fulfill diverse functionalities, especially application in electronics devices.

For TIMs, high thermal conductivity in the vertical direction is needed. Therefore, it is essential to assemble graphene into a vertically aligned architecture to facilitate heat dissipation in the normal direction of contact solid interfaces. It is already reported to prepare vertically aligned graphite film by compacting aligned graphite sheets. However, it's difficult to fabricate this type of material in an automatic and cost-effective way. Moreover, due to high stiffness and weak interlayer bonding strength of graphite, the vertically assembled graphite composite shows high hardness and is brittle at the direction perpendicular to the assembled direction. Thereby, poor mechanical properties of a film may be an obstacle to implementation in certain applications.

Therefore, improved methods to form vertically aligned graphene-based films are desired to increase the usability of thermal interface materials with high out-of-plane thermal conductivity.

SUMMARY

In view of above-mentioned and other drawbacks of the prior art, it is an object of the present invention to provide an improved graphene-based thermally conductive film and a method of manufacturing a thermally conductive film.

According to a first aspect of the invention, there is provided a method of manufacturing a laminated graphene-based thermally conductive film comprising vertically aligned graphene. The method comprises: providing a laminated film comprising a plurality of graphene film layers separated by an adhesive, the graphene film comprising graphene sheets aligned with the plane of the graphene film, wherein the plane of the graphene film is a first plane defined by a first axis and a second axis perpendicular to the first axis; forming a plurality of sections of the laminated film by cutting the laminated film perpendicularly to a second plane defined by the second axis and a third axis perpendicular to each of the first and second axis; rotating a subset of the plurality of sections about the first axis and attaching the plurality of sections to each other using an adhesive, such that a block is formed consisting of a first plurality of sections having a first rotational alignment about the first axis and a second plurality of sections having a second rotational alignment about the first axis, the second rotational alignment being different from the first rotational alignment; applying pressure and heat to the block to cure the adhesive, thereby forming a block from the plurality of sections comprising graphene film; and cutting the block along a plane of the block defined by being perpendicular the first axis, thereby forming a thermally conductive film having graphene sheets aligned perpendicularly to the plane of the thermally conductive film such that a first plurality of area portions of the thermally conductive film comprises graphene film having the first rotational alignment about the first axis, and a second plurality of area portions of the thermally conductive film comprises graphene film having the second rotational alignment about the first axis.

The resulting thermally conductive film comprises vertically aligned graphene sheets in relation to a horizontal surface plane of the thermally conductive film, which means that the thermally conductive film has anisotropic thermal conduction properties with a substantially higher thermal conductivity in the direction perpendicular to the plane of the film compared to in the plane of the film.

The graphene film forming the basis of the laminated film and subsequently of the thermally conductive film can be considered to comprise a plurality of graphene layers arranged to form a graphene film. The graphene film may for example be formed from graphene flakes having an average lateral size in the range of 2-100 µm. It is thus not required that the graphene film is or comprises a continuous graphene layer. Instead, the graphene film may consist of a stack of graphene layers, and the graphene film may thus be seen as a graphene-based film or a reinforced graphene film. The lateral size of the graphene flakes in such a graphene film determines the amount of grain boundaries in the material. Since the grain boundaries can greatly increase the phonon scattering and thereby decrease thermal conductivity, it is desirable to increase the lateral size of the graphene flakes to reduce the amount of grain boundaries, thereby improving in-plane thermal conductivity of the graphene film.

The present invention is based on the realization that a homogeneous thermally conductive film made from a laminated structure comprising a large number of stacked graphene films may suffer from anisotropic mechanical properties in the plane of the film. In other words, the Young's modulus of the film may be different in different directions of the plane of the film. This may in turn have the effect that the film breaks more easily in one direction than in others when exposed to strain. A thermally conductive film is typically arranged in contact with or between components which vary in temperature, and which may consequently expand and contract with changing temperature. There is thus a risk that a thermally conductive film attached to a component may break or be damaged along one direction in the plane of the film as a result of thermal expansion of the component.

To avoid or at least alleviate the risk of breaking the thermally conductive film upon thermal expansion, the claimed method describes a process for manufacturing a thermally conductive film having homogeneous mechanical properties in the plane of the film while maintaining the advantageous high thermal conductivity perpendicular to the plane of the film.

The mechanical and thermal properties of the thermally conductive film can be controlled for example by controlling the ratio between adhesive and graphene film, both in the laminated film and when reassembling the sections cut from the laminated film to form the described block. In practice, there may be a trade-off between the mechanical and thermal properties of the film where a larger proportion of adhesive would improve the mechanical properties while reducing overall thermal conductivity.

From the described thermally conductive film, pads of appropriate size can be cut to be used as a thermal interface material in order to improve heat transport and thereby cooling in electronics devices. Moreover, the term "film" should in the present context be seen as describing a flat structure having a surface area in the plane of the structure which is substantially larger than the thickness of the structure, and the thickness of the film can be considered to be substantially uniform over the area of the film.

According to one embodiment of the invention, cutting the laminated film comprises cutting square sections and rotating a subset of the plurality of sections comprises rotating every other section 90° about the first axis. The resulting thermally conductive film will then exhibit a chessboard pattern comprising square area portions where adjacent area portions have a 90° difference in rotational alignment of the graphene film while still exhibiting a high thermal conductivity in the vertical direction over the whole are due to the vertically aligned graphene sheets. The size of the squares can vary from a few millimeters and potentially up to centimeters. Having larger squares could simplify the manufacturing process while too large square would risk resulting in a thermally conductive film without the desired mechanical properties. Accordingly, the size of the squares can be determined based on what is required in terms of mechanical properties.

According to one embodiment of the invention, cutting the laminated film comprises cutting hexagonal sections and wherein rotating comprises rotating each section ±60° or ±120° compared to a neighboring section such that no two adjacent sections have the same rotational alignment about the first axis. The resulting thermally conductive film will then have a hexagonal pattern, also known as a honeycomb pattern, where different area portions have different rotational alignment and with vertically aligned graphene sheets over the whole surface area. To achieve a thermally conductive film where adjacent portions have different rotational alignment, three different rotations can be used to form three different types of area portions having different rotational alignment in the plane of the film.

According to a second aspect of the invention, there is provided a method of manufacturing a laminated graphene-based thermally conductive film comprising vertically aligned graphene. The method comprises: providing a laminated film comprising a plurality of graphene film layers separated by an adhesive, the graphene film comprising graphene sheets aligned with the plane of the graphene film, wherein the plane of the graphene film is a first plane defined by a first axis and a second axis perpendicular to the first axis; from the laminated film, forming a first heatsink structure having a base plate in a second plane defined by the second axis and a third axis perpendicular to each of the first and second axis and a plurality of pillars extending in the direction of the first axis with gaps between the pillars; from the laminated film, forming a second heatsink structure having a base plate in the second plane defined by the second axis and the third axis perpendicular to each of the first and second axis and a plurality of pillars extending in the direction of the first axis, wherein the pillars of the second heatsink structure have a cross section and alignment corresponding to the gaps between pillars of the first heatsink structure; rotating the second heatsink structure about the first axis; joining the second heatsink structure to the first heatsink structure by means of an adhesive such that the pillars of the second heatsink structure fill the gaps between pillars of the first heatsink structure, and such that a rotational alignment of the first heatsink structure about the first axis is different from a rotational alignment of the second heatsink structure about the first axis; removing the base plates of the first and second heat sink structure, such that a block is formed consisting of a first plurality of sections having a first rotational alignment about the first axis and a second plurality of sections having a second rotational alignment about the first axis, the second rotational alignment being different from the first rotational alignment; and cutting the block along a plane of the block defined by being perpendicular the first axis to form a thermally conductive film having graphene sheets aligned perpendicularly to the plane of the thermally conductive film such that a first plurality of area portions of the thermally conductive film comprises graphene film having the first rotational alignment about the first axis, and a second plurality of area portions of the thermally conductive film comprises graphene film having the second rotational alignment about the first axis.

A heatsink structure herein refers to the shape of the structure and not specifically to the functionality. A heatsink is commonly known to have the form of a base plate with pillars or fins extending from the base plate. In the preset context, the heatsink-structure comprises a base plate and individual pillars extending from the base plate.

According to a third aspect of the invention, there is provided a graphene-based thermally conductive film comprising a plurality of strips of a graphene film arranged so that graphene sheets of the graphene film are aligned in a direction perpendicular to the plane of the thermally conductive film, wherein the thermally conductive film comprises: a plurality of first area portions comprising strips of graphene film having a first rotational alignment in the plane of the thermally conductive film; and a plurality of second area portions comprising strips of graphene film having a second rotational alignment in the plane of the thermally conductive film, different from the first alignment.

The described graphene-based thermally conductive film exhibits uniform mechanical properties in both directions in the plane of the film, thereby being less sensible to the tensile stress and resulting strain which may occur due to thermal expansion of a material to which the thermally conductive film is attached.

According to one embodiment of the invention, the plurality of first and second area portions have a rectangular shape. Moreover, each first area portion comprises strips of graphene film being rotated 90° in the plane of the thermally conductive film compared to each second area portion.

According to one embodiment of the invention, the plurality of first and second area portions have a hexagonal shape. Each first area portion then comprises strips of graphene film being rotated ±60° or ±120° in the plane of the thermally conductive film compared to each second area portion.

According to one embodiment of the invention, there is provided an electronics assembly comprising: an electronics component; a cooling device arranged to dissipate heat from the electronics component; and the graphene-based thermally conductive film according to any one of the aforementioned embodiments sandwiched between the electronics component and the cooling device. The cooling device may for example be a heatsink.

Effects and features of the second and third aspects of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein:

FIG. 3 is a flow chart outlining general steps of a method according to an embodiment of the invention;

FIGS. 4A-F schematically illustrate steps of a method according to an embodiment of the invention;

DETAILED DESCRIPTION OF EXAMPLE EMBODIMENTS

Figure 1:
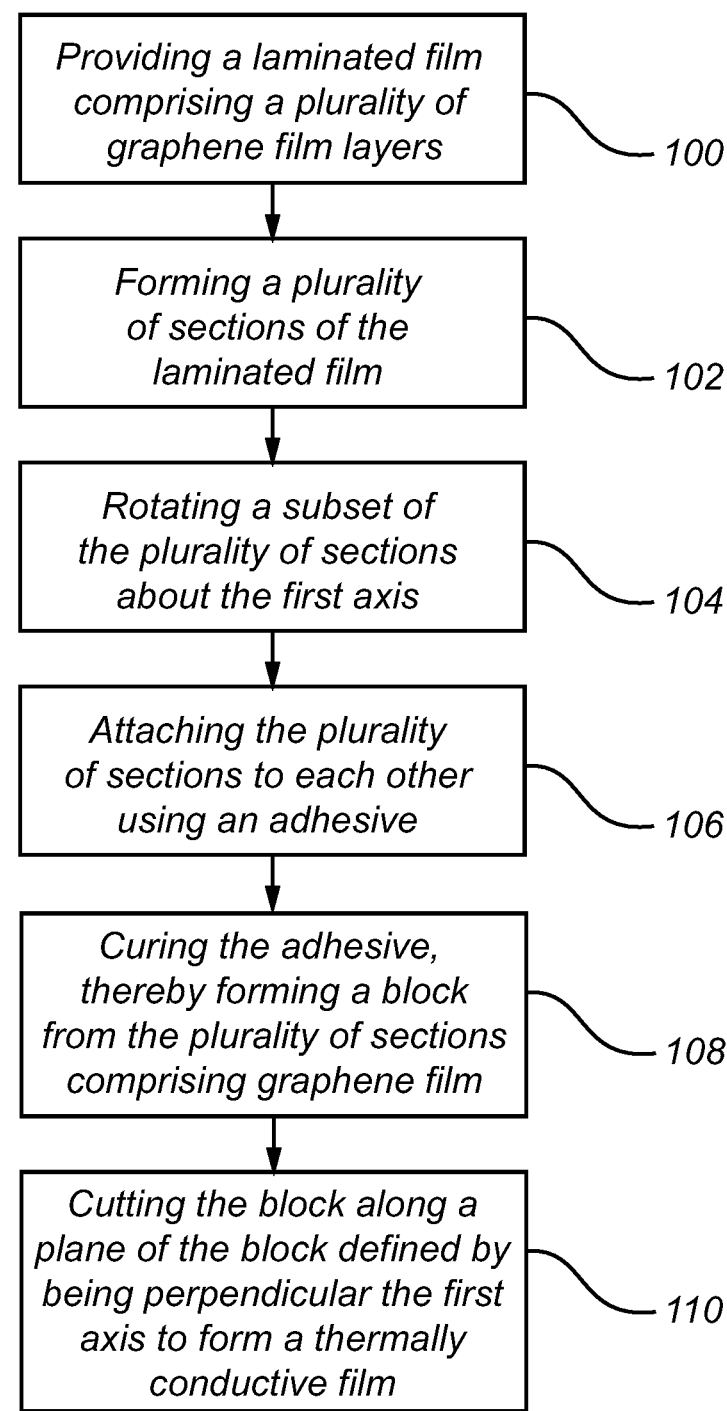
FIG. 1 is a flow chart outlining general steps of a method according to an embodiment of the invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

FIG. 1 is a flow chart outlining general steps of a method according to an embodiment of the invention, and the method will be described with further reference to FIGS. 2A-J schematically illustrating steps of the method.

Figure 2A:
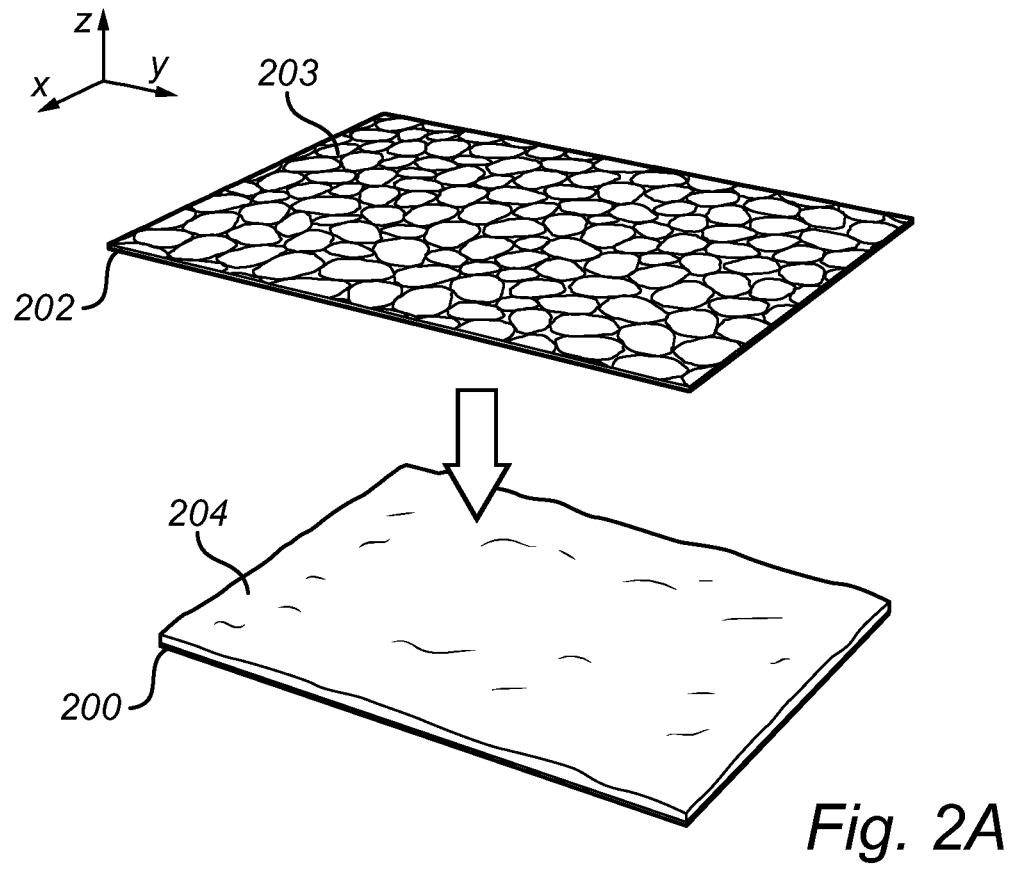
FIGS. 2A-J schematically illustrate steps of a method according to an embodiment of the invention.

FIGS. 2A-D illustrates an example method for the formation of a laminated film 206. The method comprises providing a first graphene film 200 and providing a second graphene film 202 as illustrated in FIG. 2A. A graphene film suitable for use in the present context can be formed by providing graphene oxide sheets 203 in an aqueous suspension; providing a substrate; dispensing the suspension on the substrate; heating the suspension on the substrate to form a graphene film by means of self-assembly; detaching the graphene film from the substrate; performing thermal annealing of the graphene film at a temperature in the range of 2800-3300° C. in an inert ambient; and pressing the graphene film at a pressure in the range of 50-300 MPa. By means of the above-described method, a large-scale method of producing a freestanding graphene film (GF) with an ultra-high in-plane thermal conductivity is provided. Further details of a graphene film having a high in-plane thermal conductivity and a method for manufacturing such a film can be found in PCT/SE2017/050185.

As illustrated in FIG. 2A, the graphene film 200 comprises graphene sheets 203 aligned with the plane of the graphene film 200, wherein the plane of the graphene film is a first plane, here denoted as the XY-plane, defined by a first axis X and a second axis Y perpendicular to the first axis X in a three-dimensional Cartesian coordinate system having a first, a second and a third axis denoted X, Y and Z, respectively. The graphene film 200 is in practice rotationally symmetric in the XY-plane, i.e. for rotation about the Z-axis. The graphene film 200 could also be referred to as a reinforced graphene film, a graphene-based film, or the like since it does not only consist of graphene as such.

The graphene film 200, 202 may also comprise a plurality of graphene layers having a turbostratic alignment between adjacent graphene layers. It has been found that a graphite film with turbostratic alignment between adjacent graphene layers may exhibit an improved in-plane thermal conductivity in comparison to other known graphene-based and graphite heat spreading materials. Further details of a graphene film comprising a plurality of graphene layers having a turbostratic alignment between adjacent graphene layers can be found in PCT/SE2018/000009. Moreover, even though the present invention is described with reference to a graphene-based film, a thermally conductive film could also be made in a manner described by the claimed method starting from a laminated film based on other materials instead of graphene, such as hexagonal boron nitride, MXenes, aluminum nitride, $AlO_2$ or $SiO_2$. The material needs to be electrically insulating and preferably also having a high thermal conductivity. It is also advantageous if the laminated film based on such a material has anisotropic thermal conductivity properties in the same way as described for the graphene film comprising graphene sheets.

To improve an adhesion strength between the first and second graphene films 200, 202, a layer of nanoparticles can be arranged on a surface of the first and second graphene film 200, 202. FIG. 2A further illustrates an adhesive 204 arranged on the first graphene film 200.

The layer of nanoparticles advantageously comprises needle-shaped nanoparticles configured to anchor the first graphene film 200 to the second graphene film 202 by improving the adhesion between the respective graphene film 200, 202 and the adhesive 204. A needle-shaped nanoparticle may consist of one elongated structure having a length in the range of 5 to 100 nm and an aspect ratio between length and width in the range of 5:1 to 50:1.

However, nanoparticles usable for anchoring may also comprise a plurality of more or less randomly connected needle-like nanostructures, e.g. for forming a spider-like nanostructure. Moreover, the described type of nanoparticles can be formed from e.g. $Al_2O_3$, $SiO_2$, $Fe_2O_3$, $NiO_2$, $Cr_2O_3$, ZnO, Ag, Al, Cu, Ni, Cr, Ti, Mo, Fe, Mg and/or Li. Both the nanoparticles and the adhesive may be printed, dispensed or sprayed onto the graphene film.

Figure 2B:
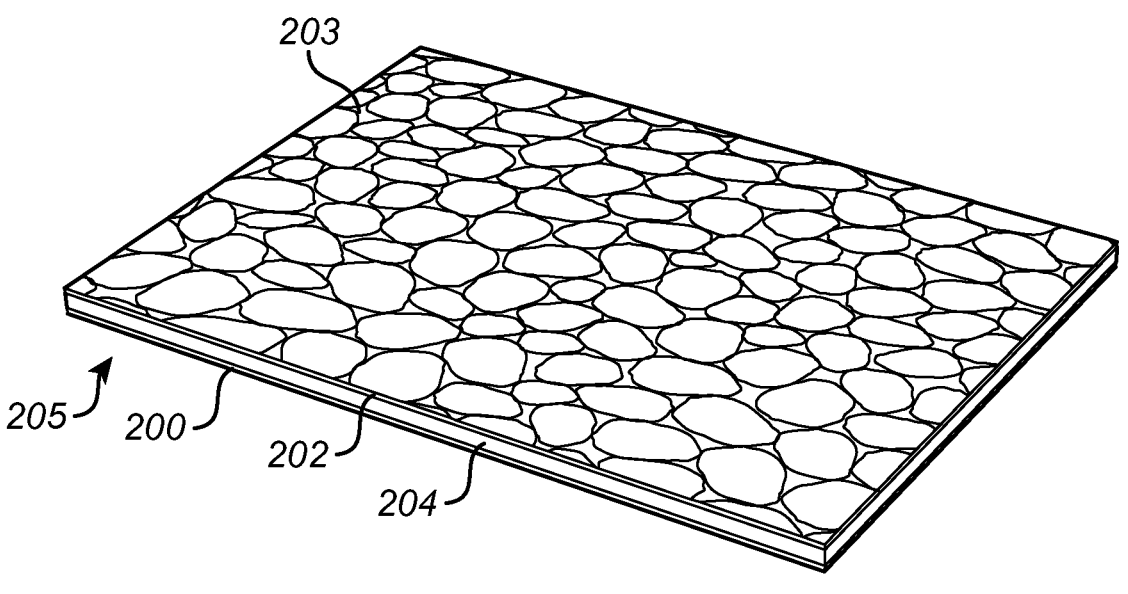

Once the nanoparticles and the adhesive 204 is deposited on the first graphene film 200, the second graphene film 202 is attached to the first graphene film 200 by means of the adhesive 204 and the layer of nanoparticles with the resulting layered film 205 illustrated in FIG. 2B. The nanoparticles will become anchored to irregularities and uneven portions of the graphene film surface, and the adhesive 204 will in turn form a bond to both the graphene film surface and to the nanoparticles. Thereby, the adhesion between the first and second graphene films 200, 202 is significantly improved compared to if only an adhesive would be used.

According to an illustrative example, a graphene film with a thickness of 10 μm was coated by an adhesive in the form of polydimethylsiloxane belonging to the group of silicone rubbers. Tetrahydrofuran was used as a solvent to adjust the viscosity of polydimethylsiloxane. The concentration of the polydimethylsiloxane in tetrahydrofuran is in the range of 25-75 wt %. The deposition process was performed using a film coater. The coating thickness of polydimethylsiloxane is defined by the thread depth of the coating bar. After coating of the adhesive, the graphene film was heated to approximately 50-70° C. for 1-20 min to remove the tetrahydrofuran. The thickness of the adhesive layer may be selected based on the desired proportion between graphene film and adhesive in the final laminate structure. A ratio of adhesive in the in the thermally conductive film may be in the range of 10 wt % to 90 wt %, and the adhesive may consist of at least one of polyurethane, silicone rubber, polyimide, epoxy resin and polyacrylic resin. The present example illustrates a substantially solid graphene film. However, it would also be possible to use a porous graphene film where holes or bubbles in the film have been formed during manufacturing. The porous graphene film may comprise internal cavities having a diameter in the range of 0.1 μm to 1000 μm, preferably 1 μm to 100 μm and more preferably 1 μm to 50 μm. Moreover, holes in the form of openings through the graphene film can be formed after formation of the film by means of punching or the like. Such holes may have a diameter in the range of 10 μm to 500 μm, preferably 10 μm to 100 μm, a hole pitch of 0.1 mm to 1 mm, preferably 0.1 mm to 0.5 mm and a hole density in the range of 10-1000 openings per square centimeter, more preferably 10-500 openings per square centimeter.

Figure 2C:
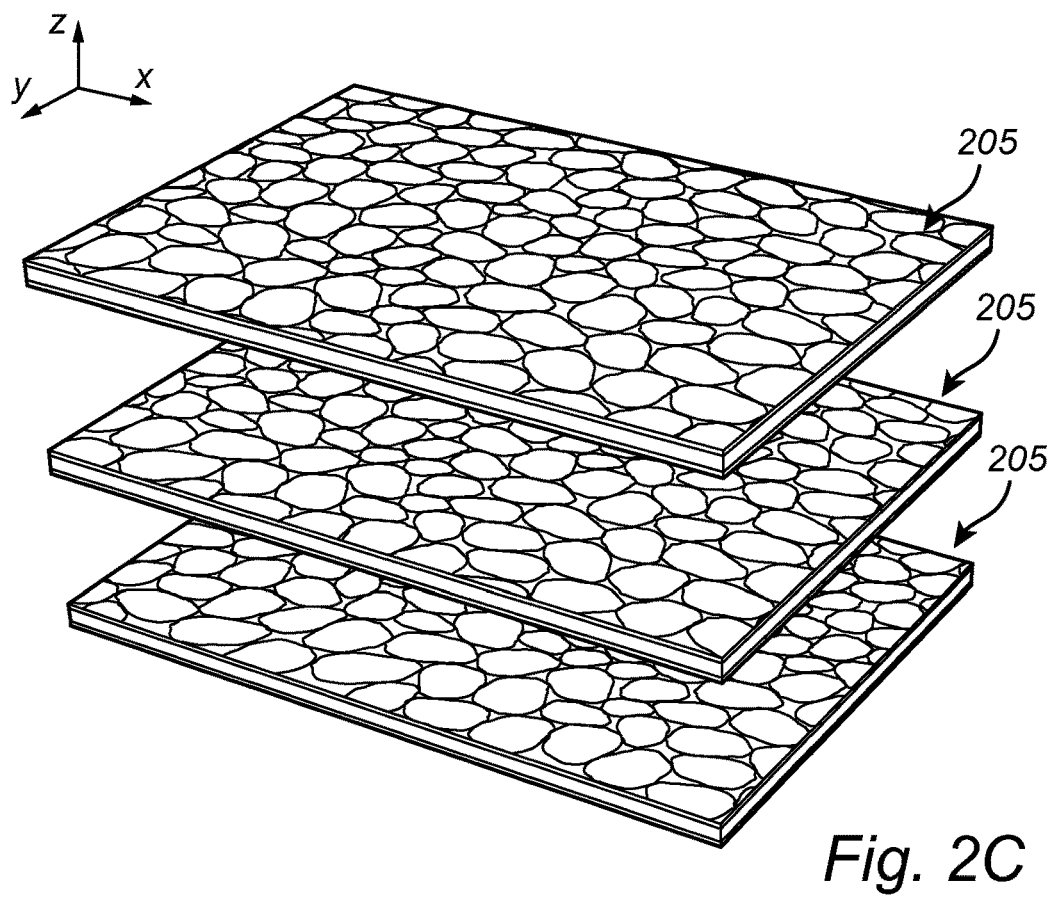

The above description outlines a method for attaching two graphene films 200, 202 to each other. Next, a laminated film can be formed by stacking a plurality of such graphene films. By combining a number of layered films 205 as illustrated in FIG. 2C, or by attaching one graphene layer at the time to a growing stack of graphene layers attached to each other by the described nanoparticles and adhesive 204, a laminated film 206 of suitable thickness can be formed.

Figure 2D:
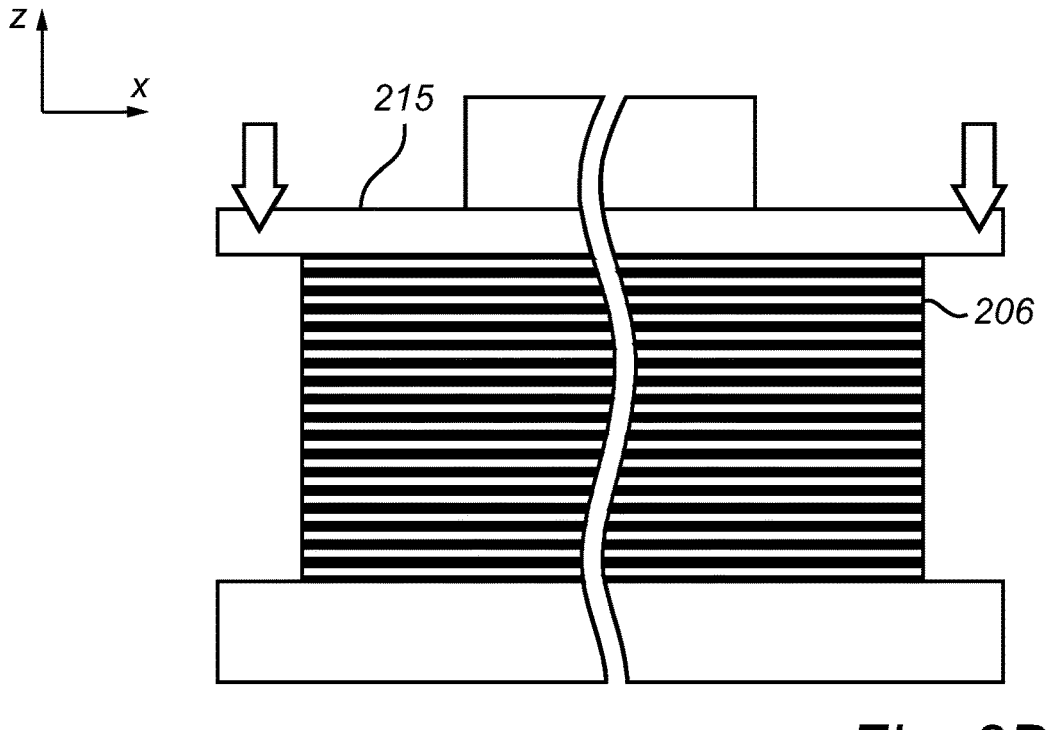

The laminated film 206 comprising the desired number of layers is formed by applying pressure using a pressure tool 215 as illustrated in FIG. 2D and by heating to cure the adhesive 204, thereby forming a laminated film 206. The pressure is in the range of 0.1 MPa to 3 MPa. The assembled laminated film 206 is subsequently put into a furnace for curing. The curing temperature is in the range of 80-200° C. and the curing time is in the range of 10 to 300 minutes.

The above description presents an example method for forming a laminated graphene-based film 206. However, the method of the invention does not rely on a specific manufacturing method for the laminated film 206, and many variations and alternatives to the above example are feasible.

The first step of the inventive method of manufacturing a laminated graphene-based thermally conductive film 212 comprising vertically aligned graphene comprises providing 100 the laminated film 206 comprising a plurality of graphene film 200 layers separated by an adhesive 204. As outlined above, the graphene film 200 comprises graphene sheets 203 aligned with the plane of the graphene film 200, herein denoted the XY-plane. The thermal conductivity of the laminated film 206 is thus higher in the XY-plane compared to in the Z-direction perpendicular to the XY-plane due to the thermal properties of graphene.

Figure 2E:
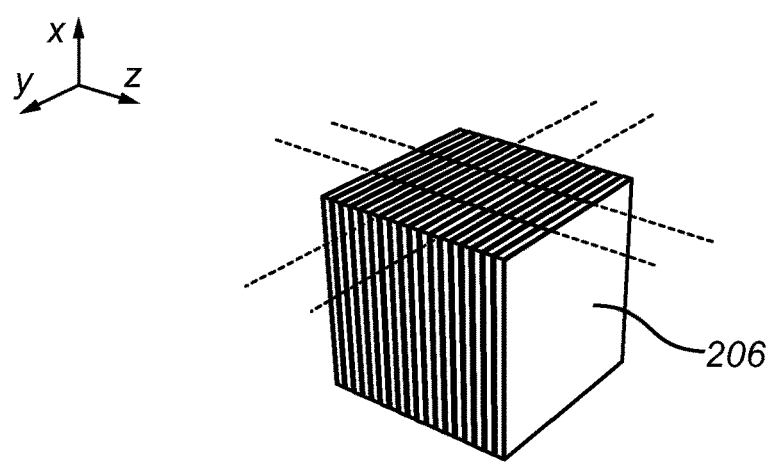

In FIG. 2E, the laminated film 206 is illustrated as standing on the "edge" with the X-axis pointing upwards compared to in previous figures and the reference coordinate system is rotated accordingly. It should also be noted that the shapes and dimensions of the laminated film 206 and other features are not drawn to scale nor are they necessarily representative of proportions of actual structures. The appended drawings are schematic in nature and are intended to clearly illustrate the relevant features of the invention.

Once the laminated film 206 is provided, it is cut 102 into a plurality of sections 208a-d, where all sections preferably but not necessarily have the same shape. The laminated film 206 is preferably cut using wire cutting or sawing, but other methods are also feasible such as laser or plasma cutting, depending on the desired shape of the sections. Here, the sections 208a-d have a square cross-section. The cuts are performed in directions perpendicular to the YZ-plane.

Figure 2F:
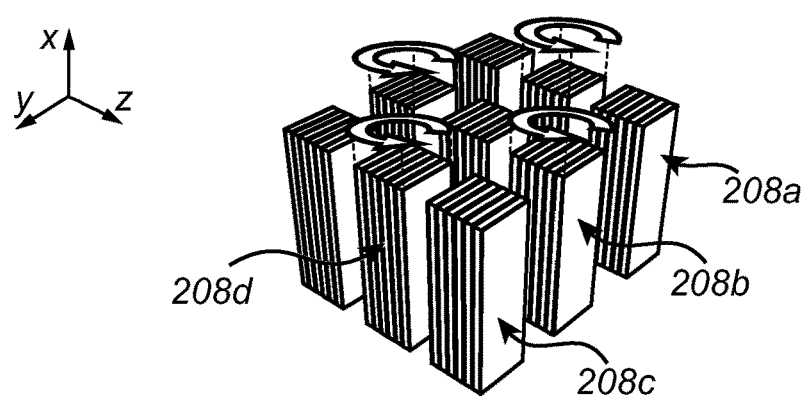

In the next step illustrated in FIG. 2F, a subset of the plurality of sections are rotated 104 about the X-axis. In the illustrated example with square cross sections, every other section is rotated 90° so that adjacent sections have different rotational alignment about the X-axis, here illustrated by 208b and 208d. Due to the symmetry in the XY-plane, a rotation of 180° would lead to adjacent sections having the same properties and is thus not desirable.

Figure 2G:
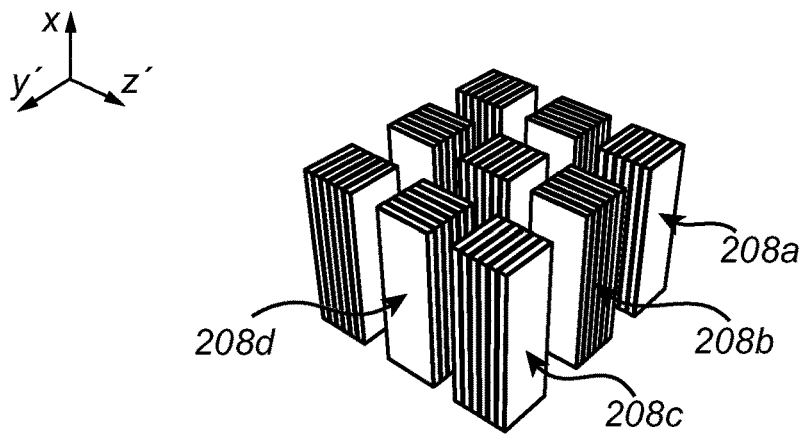

Since only a subset of sections are rotated and since the original coordinate system was defined with respect to the plane of the graphene film 200, a new coordinate system must be defined to describe the following steps as illustrated in FIG. 2G. The X-axis remains the same, but a new plane is defined here as the Y'Z'-plane. In the new coordinate system, the graphene sheets 203 are aligned with the X-axis so that the thermal conductivity, on a macro level, is higher in the X-direction compared to in the Y'- and Z'-directions.

Figure 2H:
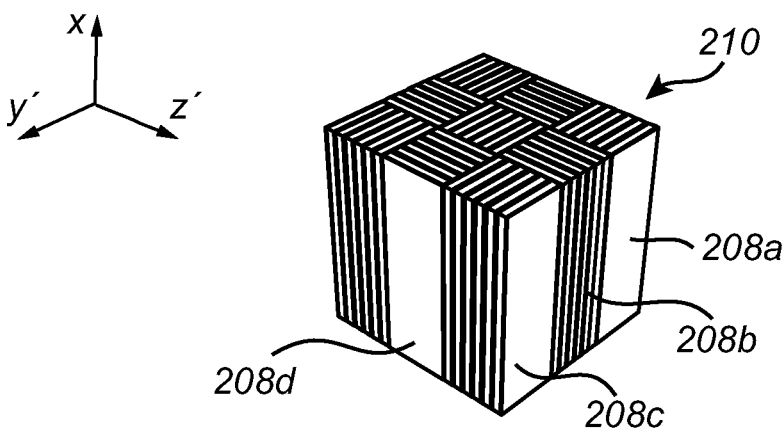
Figure 2I:
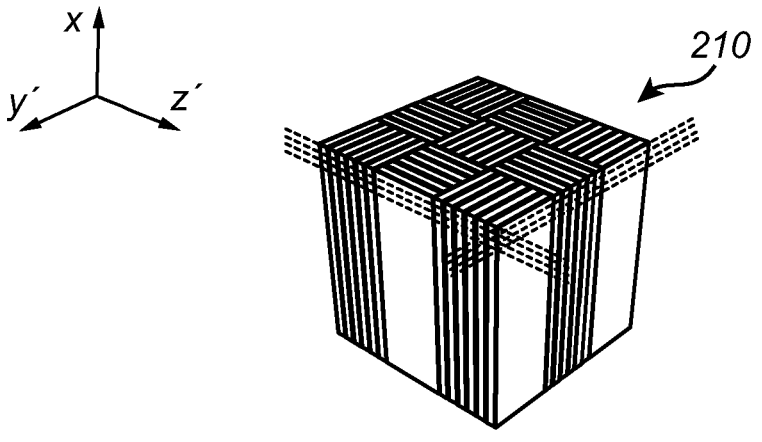

Next, as illustrated in FIG. 2H, the plurality of sections 208a-d are attached 106 to each other using an adhesive, thereby forming a block 210 consisting of a first plurality of sections 208a,c having a first rotational alignment about the first axis (X) and a second plurality of sections 208b,d having a second rotational alignment about the first axis (X), the second rotational alignment being different from the first rotational alignment.

The adhesive is cured 108 to form the block 210 from the plurality of sections comprising graphene film. Forming the block 210 may also comprise using a pressing tool. Moreover, the different sections can be placed in a suitable holder for facilitating the alignment of the different sections, dispensing of adhesive, pressing and curing.

The final step illustrated in FIG. 21 comprises cutting 110 the block 210 along the Y'Z'-plane of the block 210 which is defined by being perpendicular to the X-axis to thereby form a thermally conductive film 212 having graphene sheets aligned perpendicularly to the plane of the thermally conductive film, here the Y'Z'-plane. The block 210 is cut into slices of suitable thickness. The thermally conductive film 212 is illustrated in FIG. 2J where it can be seen that a first plurality of area portions 214a,c of the thermally conductive film 212 comprises graphene film having the first rotational alignment about the X-axis, and a second plurality of area portions 214b,d of the thermally conductive film 212 comprises graphene film having the second rotational alignment about the X-axis.

After cutting, the surfaces of the thermally conductive film 212 may advantageously be polished to smoothen the surface. The surface roughness of the final thermally conductive film is 212 preferably less than 1 μm.

With reference to the above-described manufacturing method, what in practice remains of the graphene film are thin strips attached to each other by an adhesive where the strips are aligned in different directions in the plane of the thermally conductive film 212. The block of laminated film 206 illustrated in FIG. 2E has a higher mechanical strength in the Y-direction compared to in the Z-direction since the tensile stress in the Z-direction may cause delamination. Thereby, if a thin film would be created by cutting the laminated film in the YZ-plane, the mechanical strength of the resulting film would be non-uniform in the YZ-plane which could be undesirable in certain applications.

Figure 2J:
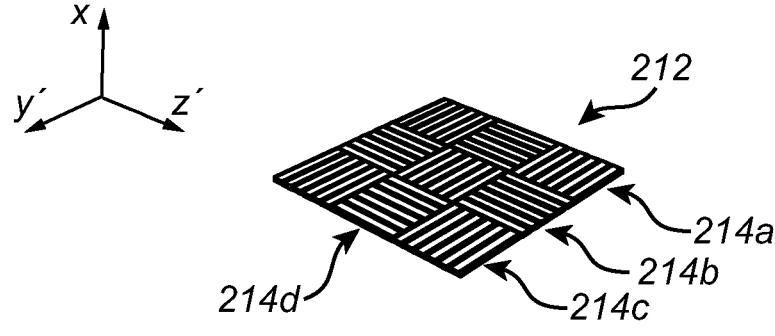

FIG. 2J thereby describes a graphene-based thermally conductive film 212 comprising a plurality of strips of a graphene film arranged so that graphene sheets of the graphene film are aligned in a direction perpendicular to the Y'Z'-plane of the thermally conductive film 212. The thermally conductive film 212 comprises a plurality of first area portions 214a,c comprising strips of graphene film having a first rotational alignment in the Y'Z'-plane of the thermally conductive film and a plurality second area portions 214b,d comprising strips of graphene film having a second rotational alignment in the Y'Z'-plane of the thermally conductive film 212, different from the first alignment. In the illustrated example, the graphene strips of the first area portions 214a,c are aligned with the Y'-axis and the graphene strips of the second area portions 214b, d are aligned with the Z'-axis, thus being rotated 90° in relation to the graphene strips of the first area portions 214a,c. The illustrated thermally conductive film 212 only comprises a small number of area portions to facilitate understanding. The skilled person readily realizes that the described film can be formed in large areas and with a large number of different area portions, e.g. arranged in a chessboard pattern.

FIG. 3 is a flow chart outlining general steps of a method according to an embodiment of the invention, and the method will be described with further reference to FIGS. 4A-F schematically illustrating steps of the method.

In large parts, the method is similar to the method described above with reference to FIGS. 2-3. The method comprises providing 300 a laminated film 206 comprising a plurality of graphene film 200 layers in the same way as described above.

Figure 4A:
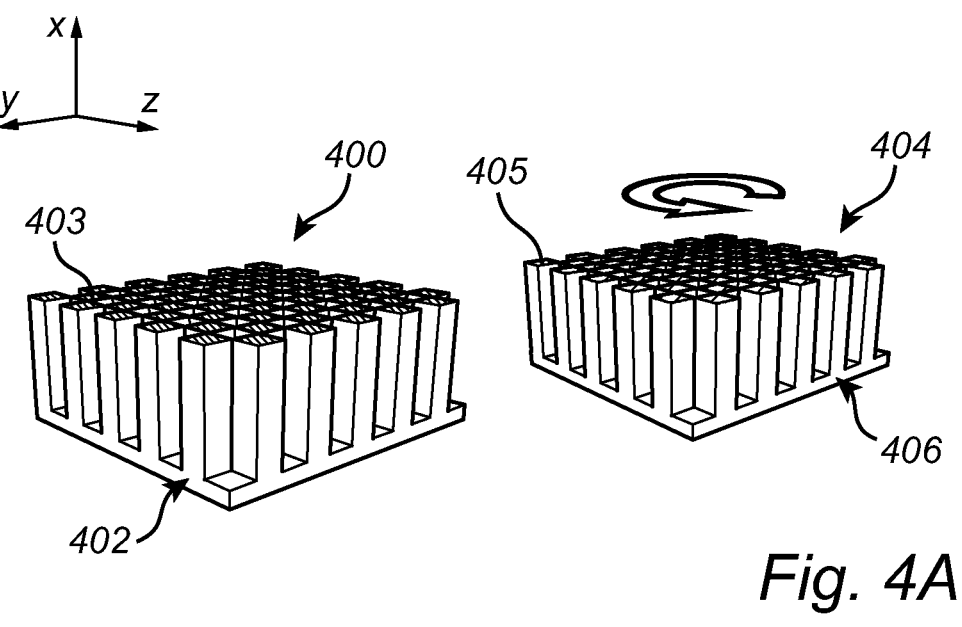

From the laminated film 206, a first heatsink structure 400 is formed 302 having a base plate 402 in the YZ-plane and a plurality of pillars 403 extending in the X-direction with gaps between the pillars as illustrated in FIG. 4A. In one embodiment, the pillars 403 have a square cross-section and gaps are of the same size and shape as the pillars 403 so that gaps and pillars 403 form a chessboard pattern when seen from above i.e. in the X-direction.

Next, a second heatsink structure 404 is formed, also having a base plate 406 in the YZ-plane and a plurality of pillars 405 extending in the X-direction with gaps between the pillars 405. However, the pillars 405 of the second heatsink structure 404 have a cross section and alignment corresponding to the gaps between the pillars 403 of the first heatsink structure 400. Correspondingly, the gaps between the pillars 405 in the second heatsink structure 404 correspond to the pillars 403 of the first heatsink structure 400. In the illustrated example, the pillars 405 and gaps of the second heatsink structure 404 form a chessboard pattern.

The following step comprises rotating 306 the second heatsink structure 404 about the X-axis and in the presented example the second heatsink structure 404 is rotated 90°.

Figure 4B:
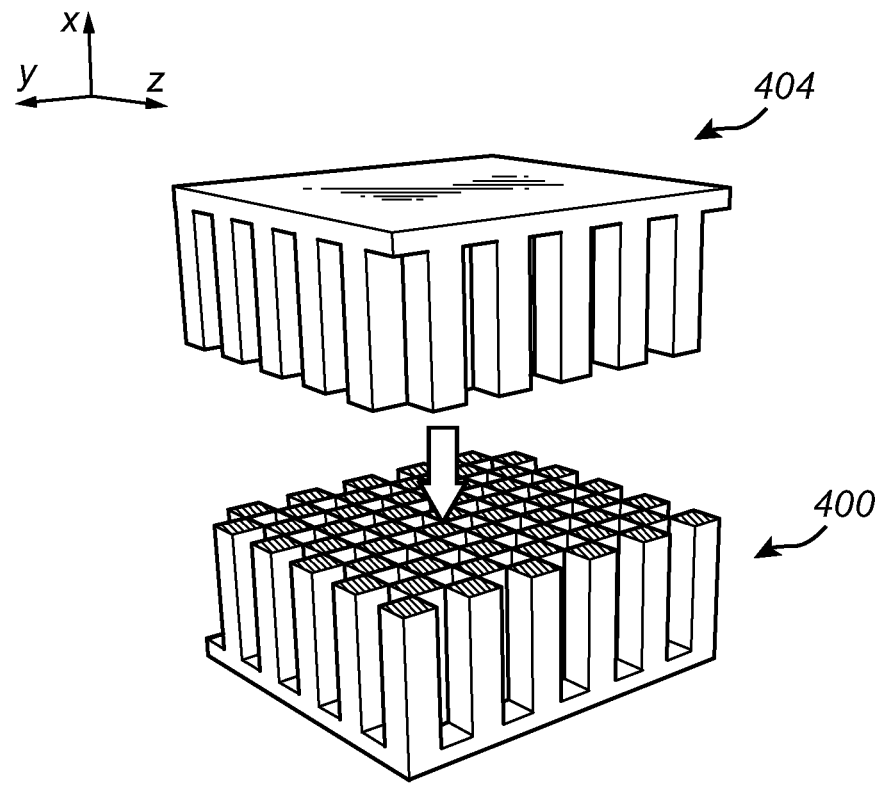
Figure 4C:
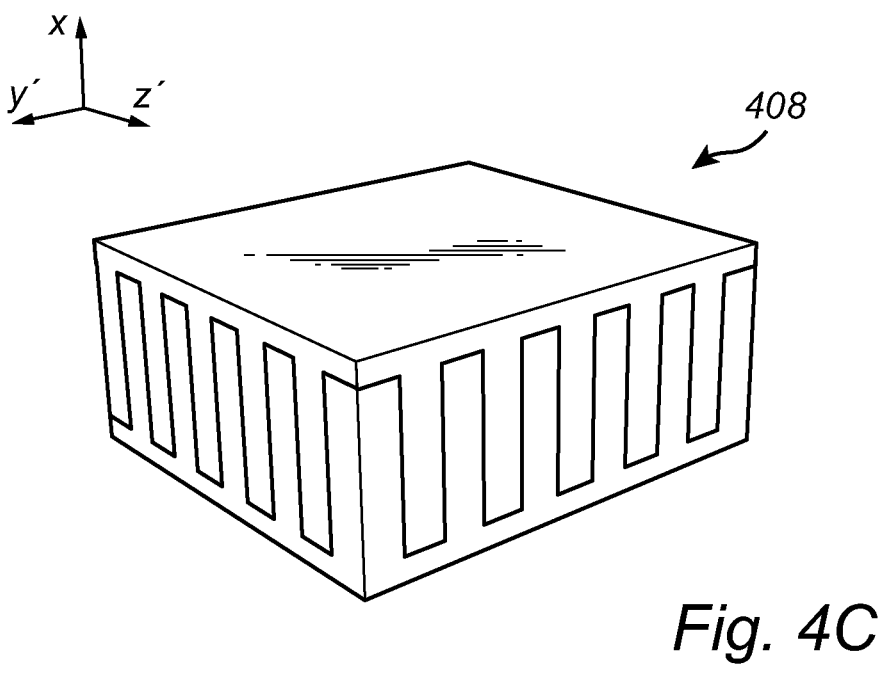

The next step, illustrated in FIG. 4B, comprises joining 308 the second heatsink structure 404 to the first heatsink structure 400 by means of an adhesive such that the pillars 405 of the second heatsink structure 404 fill the gaps between pillars 403 of the first heatsink structure 400, and such that a rotational alignment of the first heatsink structure 400 about the X-axis is different from a rotational alignment of the second heatsink structure 404 about the X-axis. The first and second heatsink structures 400, 404 are joined together to form a substantially solid structure 408 as illustrated in FIG. 4C. Curing the adhesive by applying heat and pressure may be required to properly attach the two structures 400, 404 to each other and to form a solid material. The reference coordinate system is here changed in the same manner as described with reference to FIG. 2G, with the base plates now being in the Y'Z'-plane.

Figure 4D:
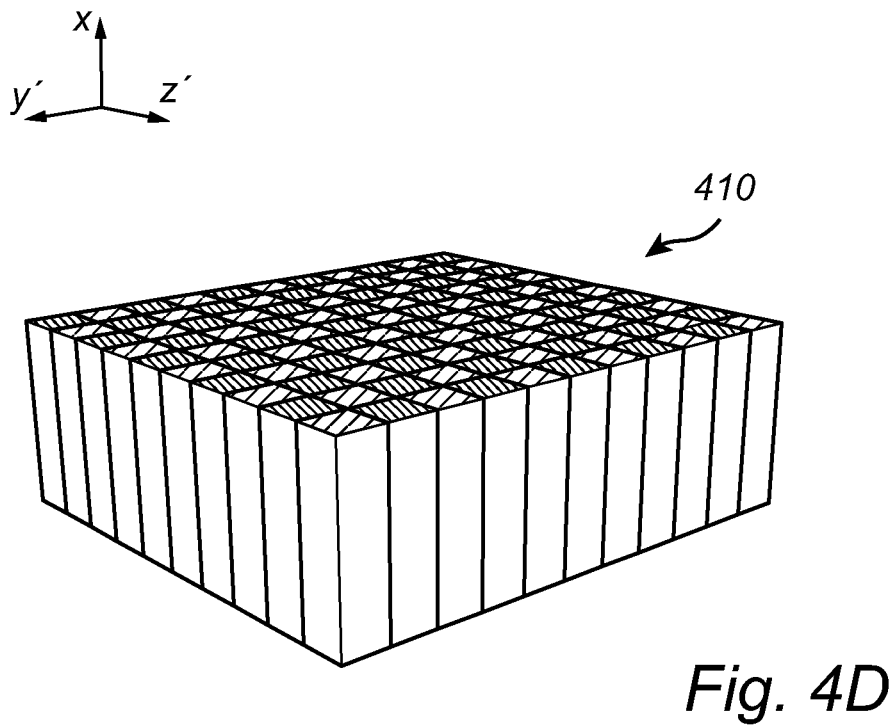

This is followed by removing 310 the base plates 402, 406 originating from the first and second heat sink structures 400, 404 as illustrated in FIG. 4D. Thereby a block 410 is formed consisting of a first plurality of sections having a first rotational alignment about the X-axis and a second plurality of sections having a second rotational alignment about the X-axis, the second rotational alignment being different from the first rotational alignment.

The final step comprises cutting 312 the block along the Y'Z'-plane in the same manner as described above and as illustrated in FIG. 4E to form the thermally conductive film 412 illustrated in FIG. 4F. The thermally conductive film 412 will thereby have area portions 214a-d comprising graphene strips of different rotational alignment about the X-axis and with graphene sheets aligned perpendicularly to the Y'Z'-plane of the thermally conductive film such that the thermal conductivity is higher in the x-direction perpendicular to the plane of the film compared to in the Y'Z'-plane. Thereby, a manufacturing method which has the potential for large scale production is described. The heatsink structures could for example be formed by laser cutting. Moreover, many different geometries of the pillars are possible while still achieving a thermally conductive film having the desired properties.

Figure 5:
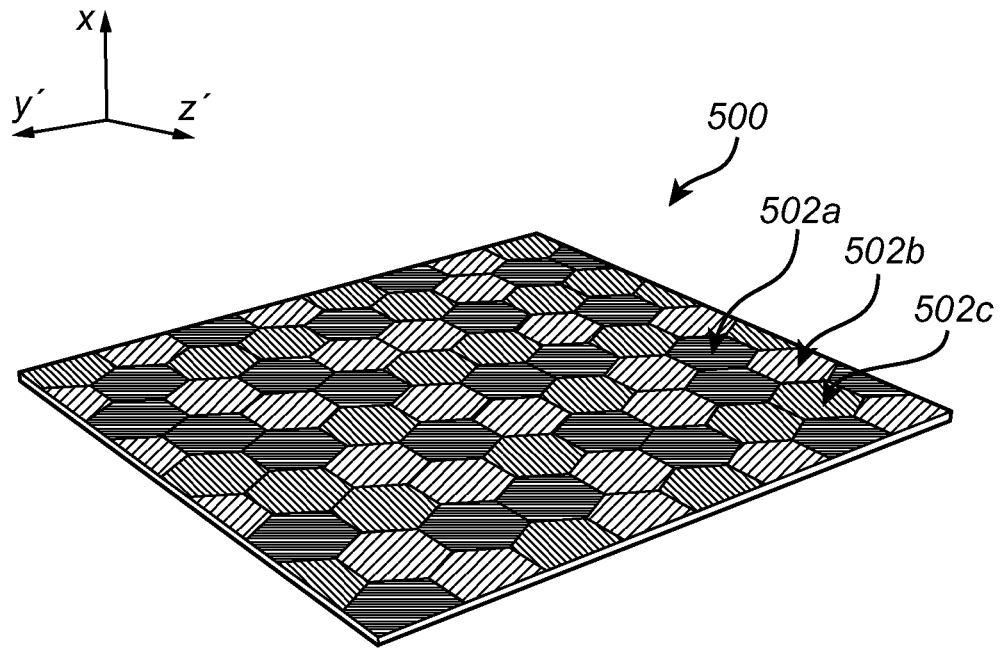
FIG. 5 schematically illustrates a thermally conductive film according to an embodiment of the invention.

FIG. 5 schematically illustrates an example embodiment of a thermally conductive film 500 comprising hexagonal area portions 502a-c where adjacent portions have different rotational alignment, which can be achieved by rotating neighboring sections by 60° or 120°.

Even though the invention has been described with reference to exemplifying embodiments thereof, many different alterations, modifications and the like will become apparent for those skilled in the art. Also, it should be noted that parts of the method may be omitted, interchanged or arranged in various ways, the method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method of manufacturing a laminated graphene-based thermally conductive film comprising vertically aligned graphene, the method comprising:

providing a laminated film comprising a plurality of graphene film layers separated by a first adhesive, the graphene film layers comprising graphene sheets aligned with a plane of the laminated film, wherein the plane of the laminated film is a first plane (XY) defined by a first axis (X) and a second axis (Y) perpendicular to the first axis;

forming a plurality of sections of the laminated film by cutting the laminated film perpendicularly to a second plane (YZ) defined by the second axis (Y) and a third axis (Z) perpendicular to each of the first and second axes;

rotating a first subset of the plurality of sections about the first axis (X);

attaching the plurality of sections to each other using a second adhesive, such that a block is formed consisting of the first subset of the plurality of sections having a first rotational alignment about the first axis (X) that has been rotated and a second subset of the plurality of sections having a second rotational alignment about the first axis (X) that has not been rotated, the second rotational alignment being different from the first rotational alignment;

curing the second adhesive, thereby forming the block from the first and second subsets of the plurality of sections; and cutting the block along a plane (Y'Z') of the block, the plane of the block being defined by being perpendicular to the first axis (X), thereby forming the laminated graphene-based thermally conductive film aligned perpendicularly to the plane (Y'Z') of the thermally conductive film such that a first plurality of area portions of the laminated graphene-based thermally conductive film has the first rotational alignment about the first axis (X), and a second plurality of area portions of the laminated graphene-based thermally conductive film has the second rotational alignment about the first axis (X).

2. The method according to claim 1, wherein the cutting the laminated film comprises cutting square sections, and wherein the rotating the first subset of the plurality of sections comprises rotating every other section of the plurality of sections 90° about the first axis (X).

3. The method according to claim 1, wherein the cutting the laminated film comprises cutting hexagonal sections, and wherein the rotating the first subset of the plurality of sections comprises rotating each section ±60° or ±120° compared to each neighboring one of hexagonal sections such that no two adjacent ones of the hexagonal sections have a same rotational alignment about the first axis.

4. The method according to claim 1, wherein the cutting of the laminated film is by wire cutting, sawing or laser cutting.

5. The method according to claim 1, wherein the curing the second adhesive comprises applying pressure and heat to the block.

* * * * *